(12) United States Patent
Xie et al.

(10) Patent No.: US 9,153,498 B2
(45) Date of Patent: Oct. 6, 2015

(54) METHODS OF FORMING SEMICONDUCTOR DEVICE WITH SELF-ALIGNED CONTACT ELEMENTS AND THE RESULTING DEVICES

(71) Applicants: GLOBALFOUNDRIES Inc., Grand Cayman (KY); International Business Machines Corporation, Armonk, NY (US)

(72) Inventors: Ruilong Xie, Niskayuna, NY (US); Xiuyu Cai, Niskayuna, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/947,670

(22) Filed: Jul. 22, 2013

(65) Prior Publication Data
US 2015/0021683 A1    Jan. 22, 2015

(51) Int. Cl.
*H01L 29/66*    (2006.01)
*H01L 21/8234*    (2006.01)

(52) U.S. Cl.
CPC *H01L 21/823425* (2013.01); *H01L 21/823475* (2013.01); *H01L 29/6653* (2013.01); *H01L 29/66545* (2013.01); *H01L 29/66628* (2013.01)

(58) Field of Classification Search
CPC .............. H01L 21/823857; H01L 21/823456; H01L 21/823425; H01L 21/4236; H01L 21/76897; H01L 29/66545; H01L 29/66628; H01L 29/6653; H01L 29/78
See application file for complete search history.

(56) References Cited

U.S. PATENT DOCUMENTS

| | | | |
|---|---|---|---|
| 8,436,404 B2 * | 5/2013 | Bohr et al. | 257/288 |
| 8,592,265 B2 | 11/2013 | Kim et al. | |
| 8,928,048 B2 * | 1/2015 | Xie et al. | 257/288 |
| 2011/0108930 A1 * | 5/2011 | Cheng et al. | 257/412 |
| 2011/0298061 A1 * | 12/2011 | Siddiqui et al. | 257/410 |
| 2012/0139061 A1 * | 6/2012 | Ramachandran et al. | 257/410 |
| 2012/0175711 A1 * | 7/2012 | Ramachandran et al. | 257/383 |
| 2013/0248950 A1 * | 9/2013 | Kang et al. | 257/288 |

OTHER PUBLICATIONS

Notice of Allowance from related U.S. Appl. No. 14/172,058 dated Apr. 6, 2015.

* cited by examiner

*Primary Examiner* — Latanya N Crawford
(74) *Attorney, Agent, or Firm* — Amerson Law Firm, PLLC

(57) ABSTRACT

One method disclosed herein includes forming a sacrificial etch stop material in a recess above a replacement gate structure, with the sacrificial etch stop material in position, forming a self-aligned contact that is conductively coupled to the source/drain region, after forming the self-aligned contact, performing at least one process operation to expose and remove the sacrificial etch stop material in the recess so as to thereby re-expose the recess, and forming a third layer of insulating material in at least the re-exposed recess.

20 Claims, 14 Drawing Sheets

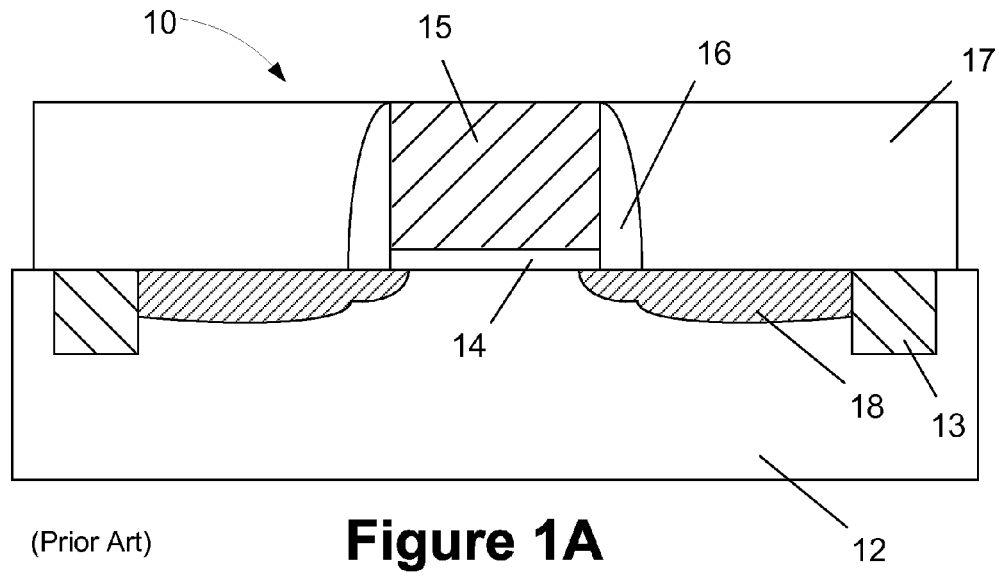
(Prior Art) Figure 1A
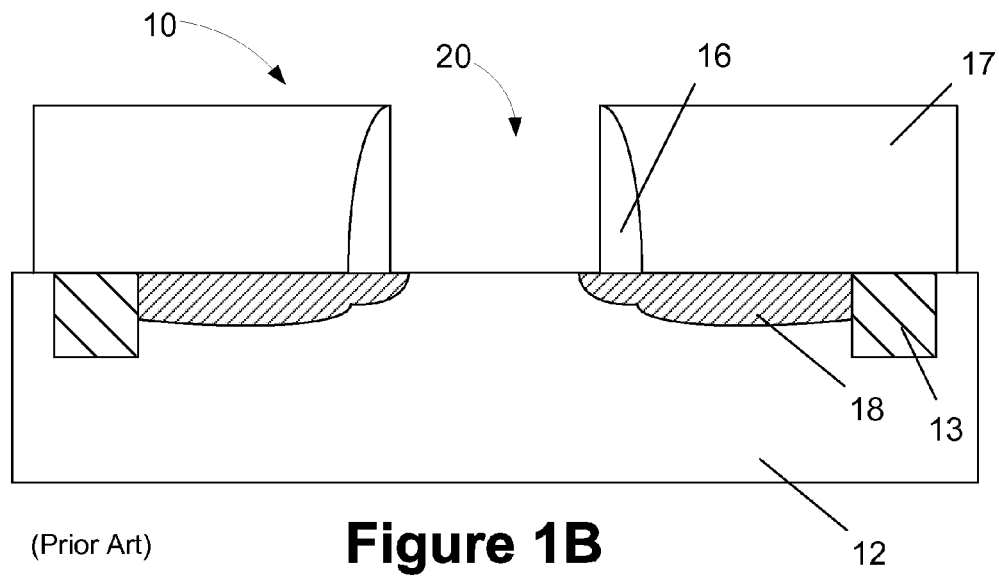
(Prior Art) Figure 1B

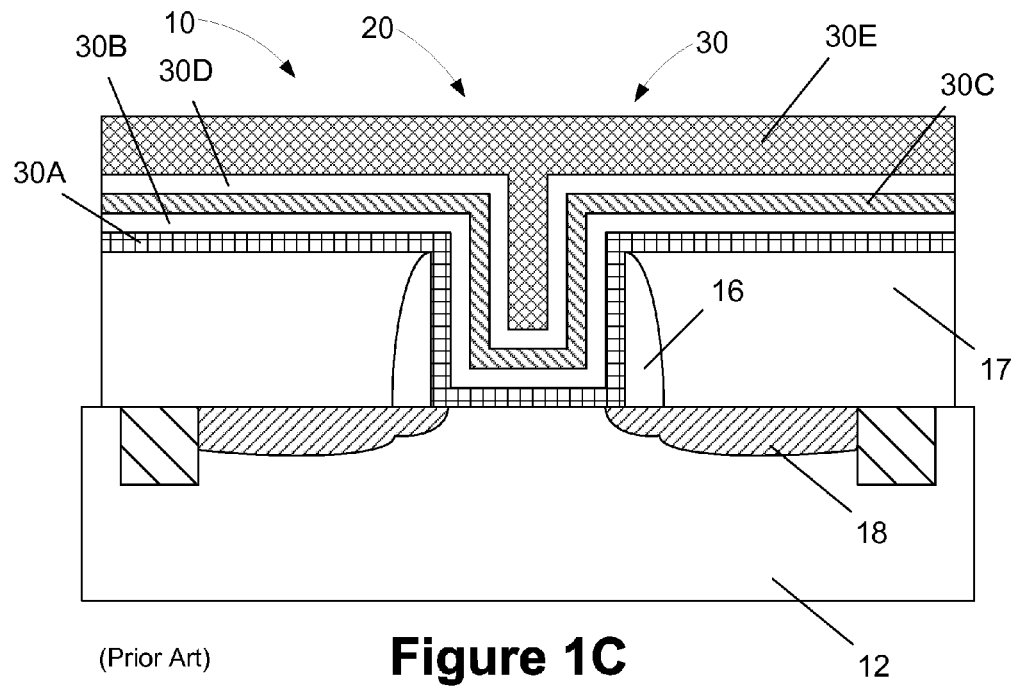
(Prior Art) Figure 1C
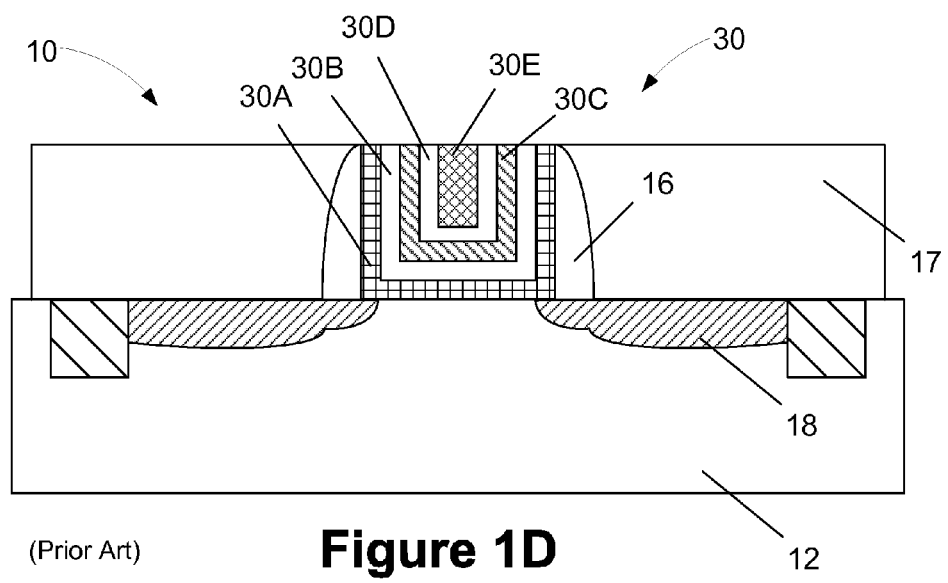
(Prior Art) Figure 1D

US 9,153,498 B2

METHODS OF FORMING SEMICONDUCTOR DEVICE WITH SELF-ALIGNED CONTACT ELEMENTS AND THE RESULTING DEVICES

BACKGROUND OF THE INVENTION

1. Field of the Invention

The present disclosure generally relates to the fabrication of integrated circuits, and, more particularly, to various methods of forming self-aligned contacts for a semiconductor device, and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1A-1D simplistically depict one illustrative prior art method for forming an HK/MG replacement gate structure using a replacement gate technique. As shown in FIG. 1A, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1C, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten. Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

Over recent years, due to the reduced dimensions of the transistor devices, the operating speed of the circuit components has been increased with every new device generation and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with density of circuit elements in the device level.

As device dimensions have decreased, the conductive contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the source/drain regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the gate electrode structures, i.e., the portions exposed by the global contact opening, as an etch mask. Thereafter, an appropriate contact material, such as tungsten and the like, may be filled into the contact trenches.

However, the aforementioned process of forming self-aligned contacts results in an undesirable loss of the materials that protect the conductive gate electrode, i.e., the gate cap layer and the sidewall spacers, as will be explained with reference to FIGS. 2A-2B. FIG. 2A schematically illustrates a cross-sectional view of an integrated circuit product 40 at an advanced manufacturing stage. As illustrated, the product 40 comprises a plurality of illustrative gate structures 41 that are formed above a substrate 42, such as a silicon substrate. The gate structures 41 are comprised of an illustrative gate insulation layer 43 and an illustrative gate electrode 44. An illustrative gate cap layer 46 and sidewall spacers 48 encapsulate and protect the gate structures 41. The gate cap layer 46 and sidewall spacers 48 are typically made of silicon nitride. Also depicted in FIG. 2A are a plurality of raised source/drain regions 50 and a layer of insulating material 52, e.g., silicon dioxide. FIG. 2B depicts the product 40 after a contact opening 54 has been formed in the layer of insulating material 52 for a self-aligned contact. Although the contact etch process performed to form the opening 54 is primarily directed at removing the desired portions of the layer of insulating material 52, portions of the protective gate cap layer 46 and the protective sidewall spacers 48 get consumed during the contact etch process, as simplistically depicted in the dashed regions 56. Given that the cap layer 46 and the spacers 48 are attacked in the contact etch process, the thickness of these protective materials must be sufficient such that, even after the contact etch process is completed, there remains sufficient cap layer material and spacer material to protect the gate structures 41. Accordingly, device manufacturers tend to make the cap layers 46 and spacers 48 "extra thick," i.e., with an additional thickness that may otherwise not be required but for the consumption of the cap layers 46 and the spacers 48 during the contact etch process. In turn, increasing the thickness of such structures, i.e., increasing the thickness of the gate cap layers 46, causes other problems, such as increasing the aspect ratio of the contact opening 54 due to the increased height, increasing the initial gate height, which makes the gate etching and spacer etching processes more difficult, etc.

The present disclosure is directed to various methods of forming self-aligned contacts for a semiconductor device, and the resulting semiconductor devices, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming self-aligned contacts for a semiconductor device, and the resulting semiconductor devices. One method disclosed includes, among other things, forming a recess above a recessed replacement gate structure that is positioned at least partially within a gate cavity that is laterally defined by sidewall spacers positioned in a first layer of insulating material, forming a sacrificial etch stop material in the recess, forming a second layer of insulating material above at least the sacrificial etch stop material and the first layer of insulating material, with the sacrificial etch stop material in position, performing at least one first etching process to form a self-aligned contact opening that extends through at least the first and second layers of insulating material thereby exposing a source/drain region of the transistor, with the sacrificial etch stop material in position, forming a self-aligned contact in the self-aligned contact opening that is conductively coupled to the source/drain region, after forming the self-aligned contact, performing at least one process operation to expose and remove the sacrificial etch stop material in the recess so as to thereby re-expose the recess and forming a third layer of insulating material in at least the re-exposed recess.

Another illustrative method disclosed herein includes, among other things, forming a gate cap layer above a recessed replacement gate structure that is positioned within a gate cavity that is laterally defined by sidewall spacers, performing at least one first etching process to remove a portion of the gate cap layer and a portion of the sidewall spacers so as to thereby define a recessed gate cap layer and a gate cap recess formed thereabove, forming a sacrificial etch stop material in the gate cap recess, forming a first layer of insulating material above at least the sacrificial etch stop material, with the sacrificial etch stop material in position, performing at least one second etching process to form a self-aligned contact opening that extends through at least the first layer of insulating material and exposes a source/drain region of a transistor, forming an initial self-aligned contact in the self-aligned contact opening that is conductively coupled to the source/drain region, after forming the self-aligned contact, performing at least one process operation to expose the sacrificial etch stop material in the gate cap recess and remove a portion of the initial self-aligned contact so as to thereby define a reduced-height self-aligned contact, removing the exposed sacrificial etch stop material in the gate cap recess so as to thereby expose the recessed gate cap layer and forming a second layer of insulating material above the exposed recessed gate cap layer.

Yet another illustrative method disclosed herein includes, among other things, forming a recessed replacement gate structure that is positioned within a gate cavity that is laterally defined by sidewall spacers, performing at least one first etching process to remove a portion of at least the sidewall spacers so as to thereby define a recessed gate recess within the gate cavity, forming a sacrificial gate cap material in the recessed gate recess, forming a first layer of insulating material above at least the sacrificial gate cap material, with the sacrificial etch stop material in position, performing at least one second etching process to form a self-aligned contact opening that extends through at least the first layer of insulating material and exposes a source/drain region of a transistor, forming a self-aligned contact in the self-aligned contact opening that is conductively coupled to the source/drain region, after forming the self-aligned contact, performing at least one process operation to remove the first layer of insulating material so as to thereby expose the sacrificial gate cap material, removing the exposed sacrificial gate cap material so as to thereby expose the recessed replacement gate structure and forming a second layer of insulating material on and in contact with the exposed recessed replacement gate structure.

One illustrative device disclosed herein includes, among other things, a replacement gate structure positioned above a semiconductor substrate, sidewall spacers positioned adjacent the replacement gate structure, a gate cap layer positioned above the replacement gate structure, wherein the gate cap layer has an upper surface that is positioned a first distance above a surface of the substrate, a first layer of insulating material formed above the substrate adjacent the sidewall spacers, wherein the first layer of insulating material has an upper surface that is positioned a second distance above the surface of the substrate, and a conductive contact positioned in an opening formed in at least the layer of insulating material, wherein the conductive contact is conductively coupled to the source/drain region of the transistor, wherein the conductive contact has an upper surface that is positioned the second distance above the surface of the substrate, wherein the first distance is less than the second distance.

Yet another illustrative device disclosed herein includes, among other things, a replacement gate structure positioned above a semiconductor substrate, wherein the replacement gate structure has an upper surface, sidewall spacers positioned adjacent the replacement gate structure, wherein each of the sidewall spacers has an upper surface, a first layer of insulating material formed above the substrate adjacent the sidewall spacers, wherein the first layer of insulating material has an upper surface, wherein, relative to an upper surface of the substrate, the upper surface of the replacement gate structure and the upper surfaces of the sidewall spacers are positioned at a level below the upper surface of the first layer of insulating material, and wherein the first layer of insulating material, the upper surface of the replacement gate structure and the upper surfaces of the sidewall spacers at least partially define a recessed gate cavity, a conductive contact positioned in an opening formed in at least the first layer of insulating material, wherein the conductive contact is conductively coupled to a source/drain region of the transistor, and a second layer of insulating material positioned in at least the recessed gate cavity and above the first layer of insulating material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art method of forming a gate structure of the transistors using a so-called "replacement gate" technique;

Figure 2A:
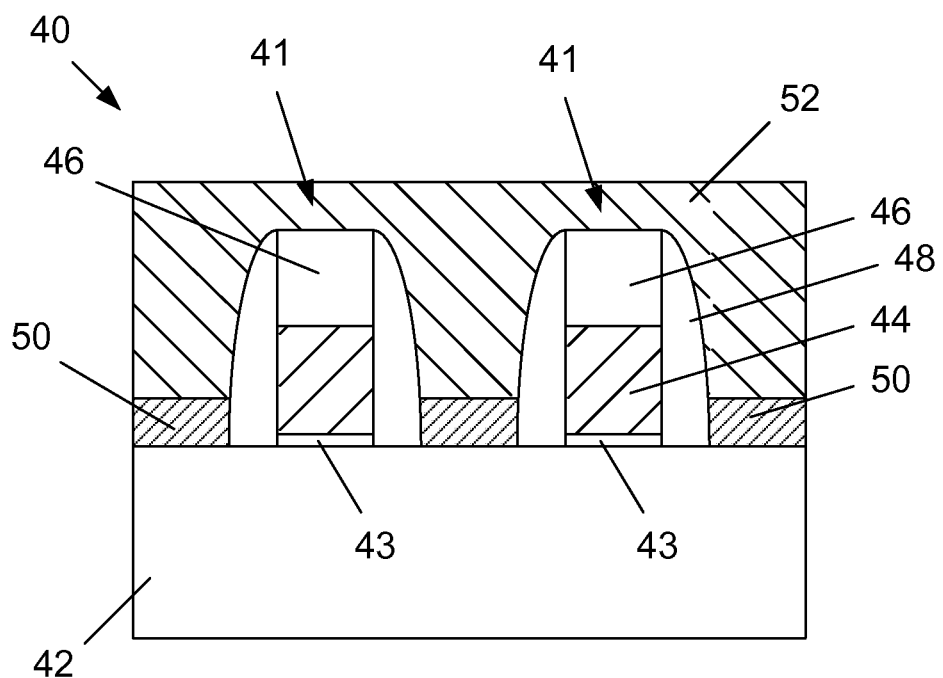
FIGS. 2A-2B schematically illustrate a cross-sectional view of an illustrative prior art integrated circuit product that employs self-aligned contacts.
Figure 2B:
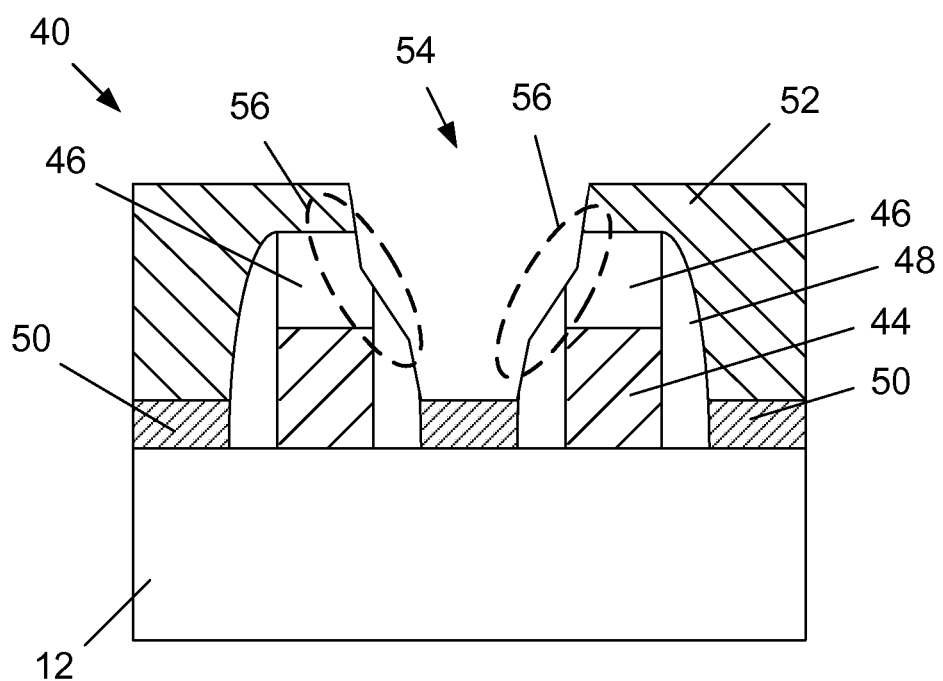

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming self-aligned contacts for a semiconductor device, and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

As will be appreciated by those skilled in the art after a complete reading of the present application, the inventions disclosed herein may be employed in forming integrated circuit products using planar transistor devices, as well as so-called 3D devices, such as FiNFETs, or a combination of such devices. For purposes of disclosure, reference will be made to an illustrative process flow wherein an integrated circuit product is formed with a plurality of planar transistor devices. However, the inventions disclosed herein should not be considered to be limited to such an illustrative example.

Figure 3A:
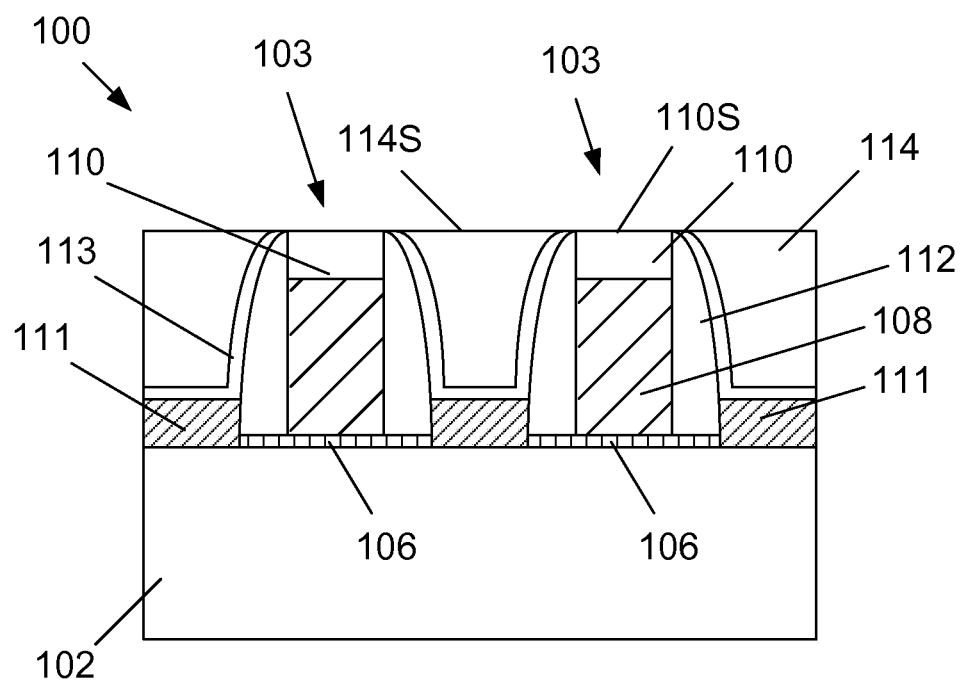
FIGS. 3A-3M depict one illustrative method disclosed herein for forming self-aligned contacts for a semiconductor device, and the resulting semiconductor device.

FIGS. 3A-3M depict one illustrative method disclosed herein for forming self-aligned contacts for a semiconductor device 100, and the resulting semiconductor device 100. FIG. 3A is a simplified view of the illustrative integrated circuit product 100 at an early stage of manufacturing, wherein a pair of illustrative transistors will be formed in and above the semiconductor substrate 102. So as not to obscure the inventions disclosed herein, isolation regions that are formed in the substrate 102 to define active regions where the transistors will be formed are not depicted in the attached drawings. The transistors may be either NMOS or PMOS transistors. Additionally, various doped regions, e.g., source/drain regions, halo implant regions, well regions and the like, are also not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

In the example disclosed herein, the transistors will be formed using a replacement gate technique. Accordingly, FIG. 3A depicts the product 100 at a point in fabrication wherein sacrificial gate structures 103 have been formed above the substrate 102. Also depicted are illustrative gate cap layers 110, sidewall spacers 112, an etch stop liner layer 113, a plurality of raised source/drain regions 111 and a layer of insulating material 114, e.g., silicon dioxide. The gate cap layers 110, sidewall spacers 112 and the etch stop liner 113 are typically made of silicon nitride. At this point in the replacement gate process flow, an anneal process would have already been performed to activate the implanted dopant materials and repair any damage to the substrate 102 due to the various ion implantation processes that were performed. The sacrificial gates structures 103 include a sacrificial gate insulation layer 106 and a dummy or sacrificial gate electrode 108. The various components and structures of the product 100 may be formed using a variety of different materials and by performing a variety of known techniques. For example, the sacrificial gate insulation layer 106 may be comprised of silicon dioxide and the sacrificial gate electrode 108 may be comprised of polysilicon. The layers of material depicted in FIG. 3A, as well as the layers of material described below, may be formed by any of a variety of different known techniques, e.g., a chemical vapor deposition (CVD) process, an atomic layer deposition (ALD) process, a thermal growth process, spin-coating techniques, etc. The illustrative raised source/drain regions 111 may be formed in the substrate using traditional techniques, e.g., formation of cavities in the substrate 102 that are self-aligned to the spacers 112, epi deposition of a semiconductor material in the cavities, doping, etc. However, it should be understood that the presently disclosed inventions may be practiced on transistor devices that have regular or planar source/drain regions. Moreover, as used herein and in the attached claims, the word "adjacent" is to be given a broad interpretation and should be interpreted to cover situations where one feature actually contacts another feature or is in close proximity to that other feature. For example, with reference to FIG. 3A, the layer of insulating material 114 is formed adjacent to the sacrificial gate electrode 108, the sidewall spacers 112 and the liner 113, but in the depicted example, the layer of insulating material only contacts the liner 113. Similarly, it can be stated that the sidewall spacers 112 are formed either adjacent to the gate electrode 108 or contacts the gate electrode 108.

With continuing reference to FIG. 3A, a planarization process was performed on the layer of insulating material 114 such that the upper surface 114S of the layer of insulating material 114 is substantially even with the upper surface 110S of the gate cap layers 110. Importantly, this planarization process exposes the upper surface 110S of the gate cap layers 110 such that they can be removed. In one illustrative embodiment, the planarization process may be a chemical mechanical planarization (CMP) process that stops on the gate cap layers 110, or it may be a timed etch-back process that removes the layer of insulating material 114 selectively relative to the gate cap layers 110. In one embodiment, the layer of insulating material 114 may be a layer of silicon dioxide that is formed by performing a CVD process. The layer of insulating material 114 may be formed to any desired thickness.

Figure 3B:
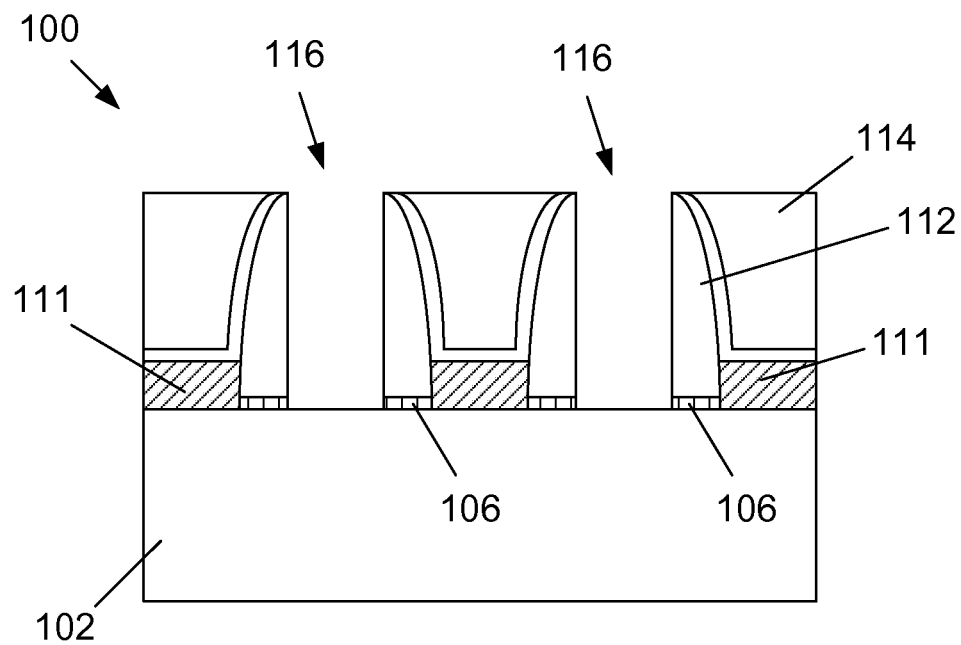

FIG. 3B depicts the product 100 after several process operations, e.g., one or more wet or dry etching processes, were performed to remove the gate cap layers 110, the sacrificial gate electrode 108 and the sacrificial gate insulation layers 106 to thereby define gate cavities 116 where replacement gate structures will subsequently be formed for the transistors. Typically, the sacrificial gate insulation layer 106 is removed as part of the replacement gate technique, as depicted herein. However, the sacrificial gate insulation layer 106 may not be removed in all applications. Even in cases where the sacrificial gate insulation layer 106 is intentionally removed, there will typically be a very thin native oxide layer (not shown) that forms on the substrate 102 within the gate cavities 116.

Figure 3C:
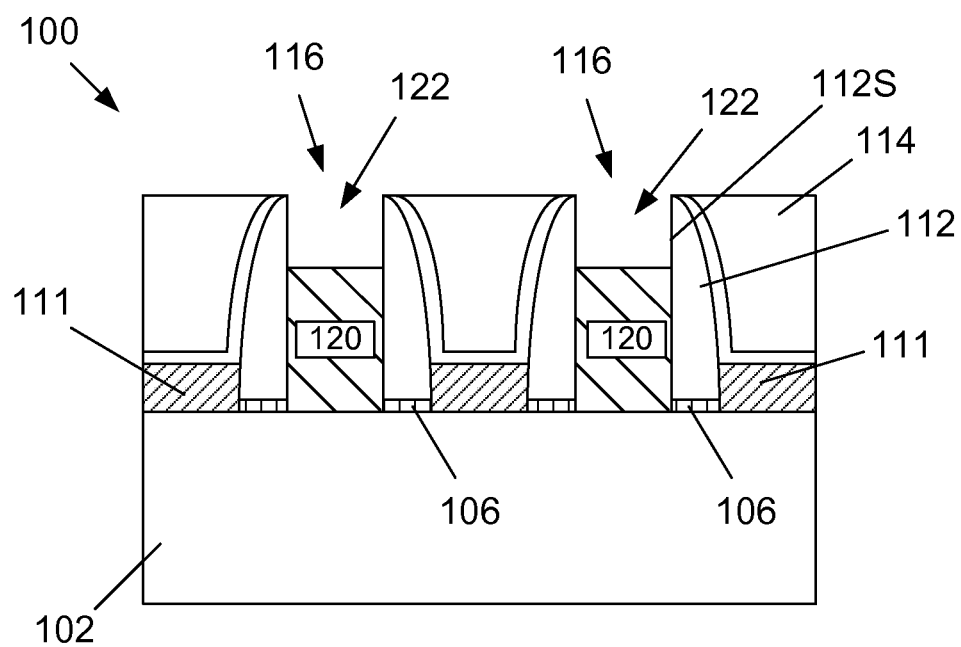

FIG. 3C depicts the product after several process operations were performed. First, a pre-clean process was performed in an attempt to remove all foreign materials from within the gate cavities 116 prior to forming the various layers of material that will become part of the replacement gate structures. Thereafter, several known processing operations were performed to form a schematically depicted replacement gate structure 120 in each of the gate cavities 116. The replacement gate structures 120 depicted herein are intended to be representative in nature of any type of gate structure that may be employed in manufacturing integrated circuit products using so-called gate-last (replacement-gate) manufacturing techniques. The replacement gate structure 120 typically comprises a high-k (k value greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer (not individually shown), such as tungsten or aluminum. FIG. 3C also depicts the product 100 after one or more dry or wet etching processes were performed to remove portions of the materials of the replacement gate structure 120. This recessing process defines a recess 122 where a portion of the internal sidewall surfaces 112S of the spacers 112 are exposed. The depth of the recess 122 may vary depending upon the particular application.

Figure 3D:
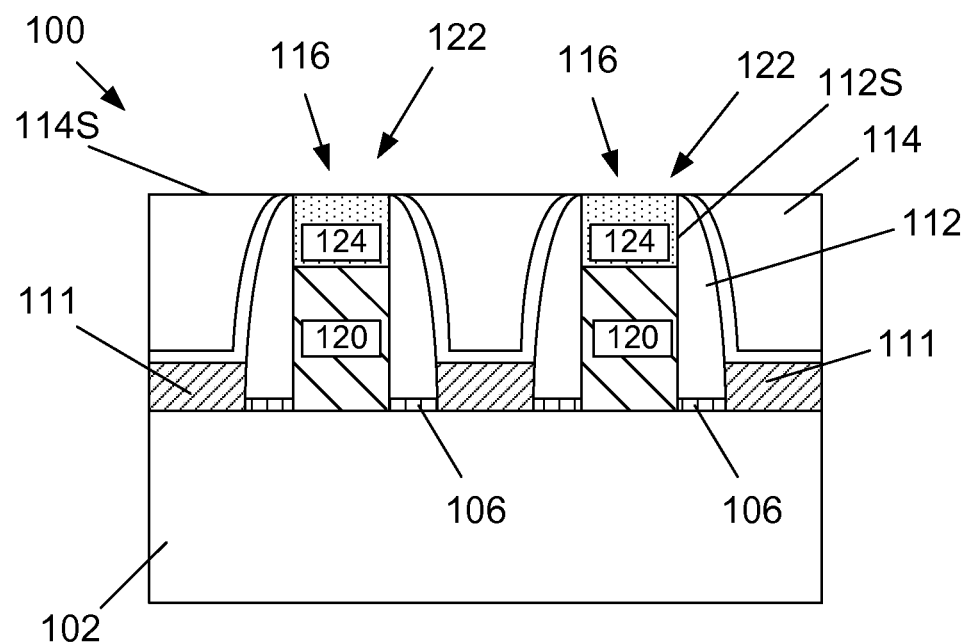

FIG. 3D depicts the product 100 after a gate cap layer 124 was formed in each of the recesses 122. The gate cap layers 124 may be comprised of a variety of materials, e.g., silicon nitride, or a bottom layer of silicon dioxide covered with an upper layer of silicon nitride. In one embodiment, the cap layers 124 may be formed by blanket-depositing a cap layer material, e.g., silicon nitride, on the product 100 so as to over-fill the gate cavities 116. Then, one or more planarization processes, e.g., CMP processes, may be performed to remove the portions of the cap layer material positioned above the surface 114S of the layer of insulating material 114 and outside of the recesses 122.

Figure 3E:
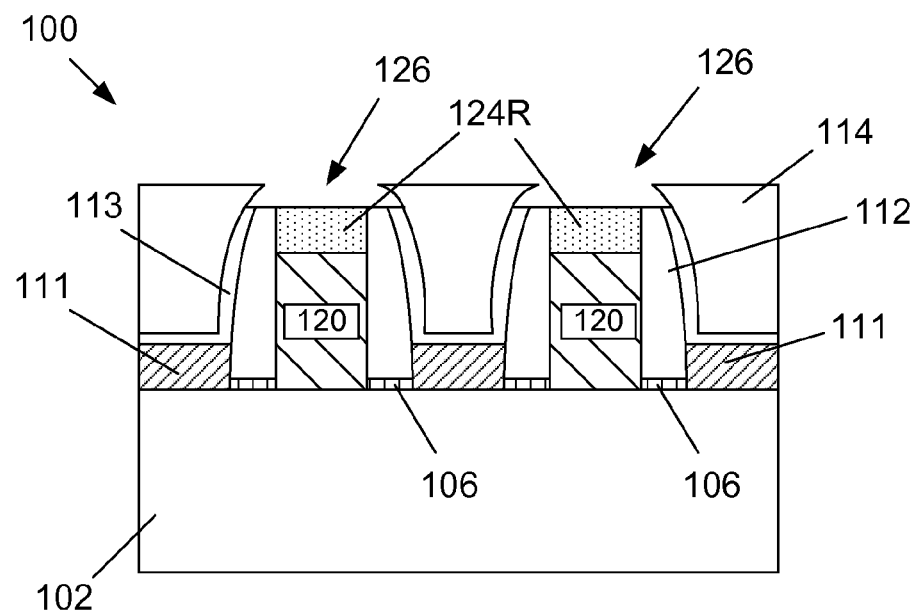

FIG. 3E depicts the product 100 after one or more dry or wet etching processes were performed to remove portions of the gate cap layers 124, the sidewall spacers 112 and the liner layer 113 to define what will be referred to as gate cap recesses 126 above the recessed gate cap layers 124R. In one illustrative embodiment, the gate cap recesses 126 may be formed by performing a timed etch-back process. The depth of the gate cap recesses 126 may vary depending upon the particular application, e.g., 5-15 nm.

Figure 3F:
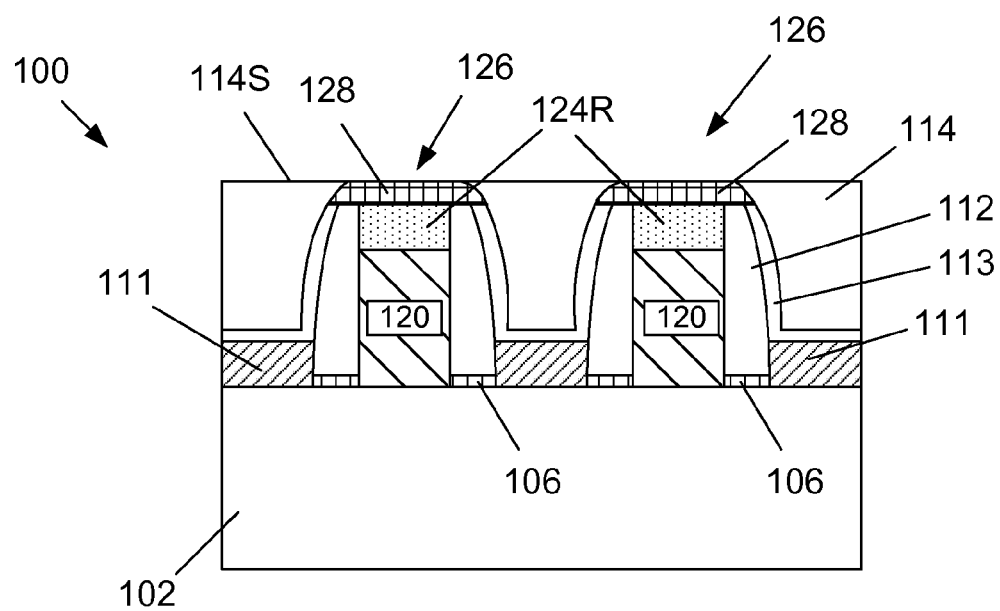

FIG. 3F depicts the product 100 after a sacrificial etch stop material layer 128 was formed in each of the gate cap recesses 126. The sacrificial etch stop material layer 128 may be comprised of a variety of materials that may be used to protect the recessed gate cap layers 124 and the underlying sidewall spacers 112 when a contact opening is subsequently etched in the layer of insulating material 114. For example, the sacrificial etch stop material layer 128 may be comprised of a metal or a metal compound, e.g., titanium-carbon, titanium nitride, a high-k material, polysilicon, amorphous silicon, etc. In one embodiment, the sacrificial etch stop material layers 128 may be formed by blanket-depositing a layer of the sacrificial material, e.g., TiC, on the product 100 so as to over-fill the recesses 126 and thereafter performing one or more CMP processes to remove the portions of the layer of sacrificial material positioned above the surface 114S of the layer of insulating material 114 and outside of the gate cap recesses 126.

Figure 3G:
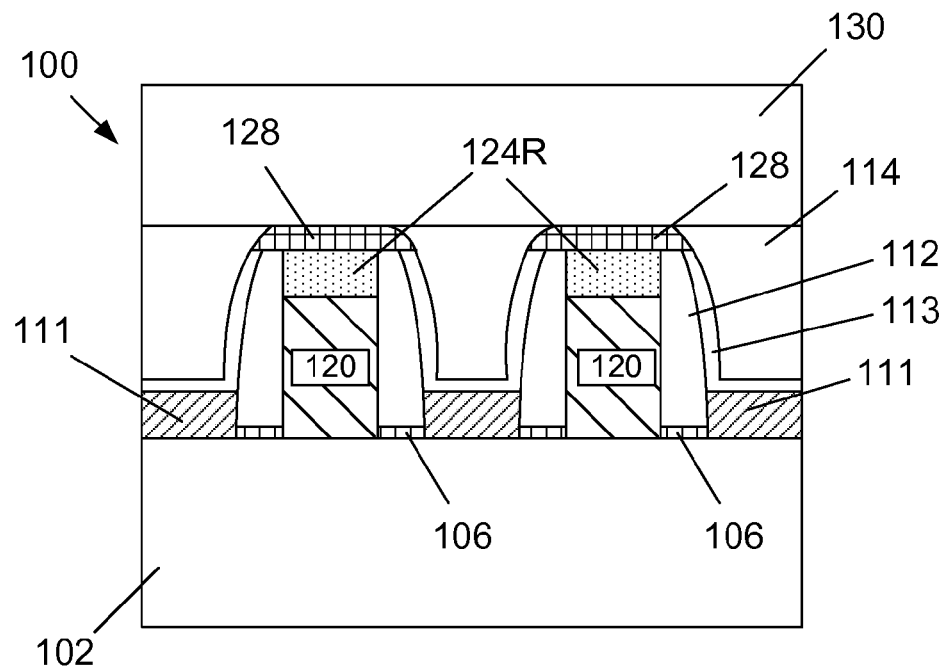

FIG. 3G depicts the product 100 after a layer of insulating material 130, e.g. silicon dioxide, etc., was deposited above the product 100. In one embodiment, the layer of insulating material 130 may be a layer of silicon dioxide that is formed by performing a CVD process. The layer of insulating material 130 may be formed to any desired thickness, and it may be made of the same material as that of the layer of insulating material 114 or it may be a different material.

Figure 3H:
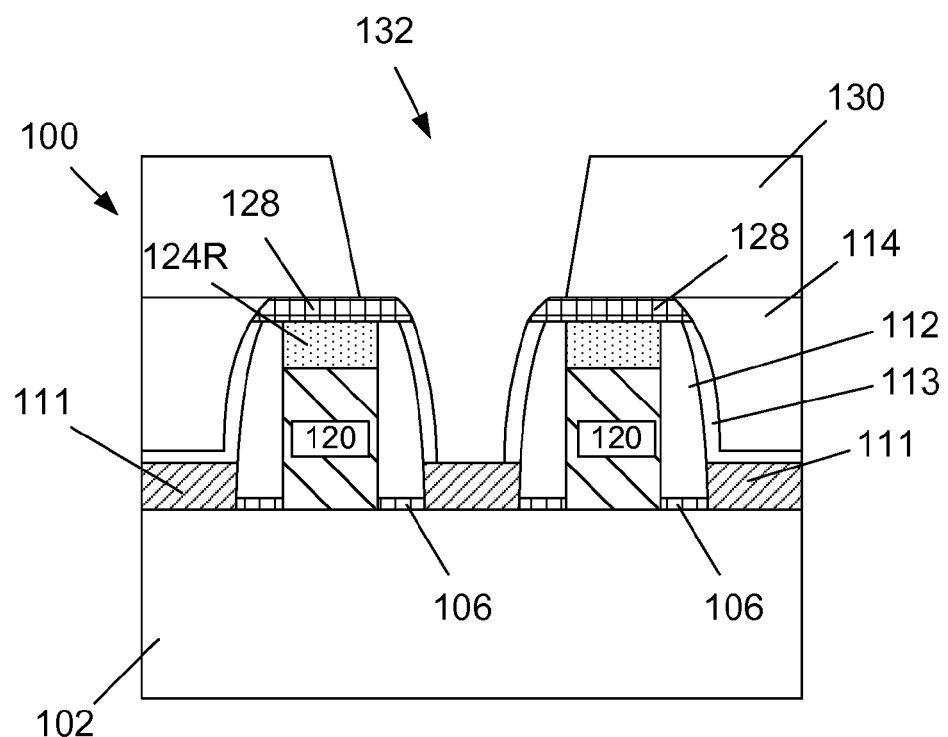

FIG. 3H depicts the product 100 after one or more etching processes were performed on the product 100 through a patterned etch mask (not shown), such as a patterned layer of photoresist material, to remove portions of the layers of insulating material 130, 114 and the liner layer 113 to thereby define an illustrative self-aligned contact opening 132 that exposes the raised source/drain region 111 so that contact can be made with the source/drain region 111. Only a single contact opening is depicted in the drawings. However, those skilled in the art will appreciate and understand that, in practice, such a contact opening 132 would typically be formed on both sides of each of the transistors. In the depicted example, the self-aligned contact opening 132 is depicted as being somewhat misaligned or enlarged such that portions of the sacrificial etch stop material layers 128 are exposed within the contact opening 132. Note, that the sacrificial etch stop material layer 128 servers to protect the recessed gate cap layers 124R and the underlying portions of the sidewall spacers 112 during the etch sequence that is performed to form the contact opening 132. That is, the sacrificial etch stop material layers 128 tend to limit the unwanted consumption of the recessed gate cap layers 124R and the sidewall spacers 112 during the contact etch process.

Figure 3I:
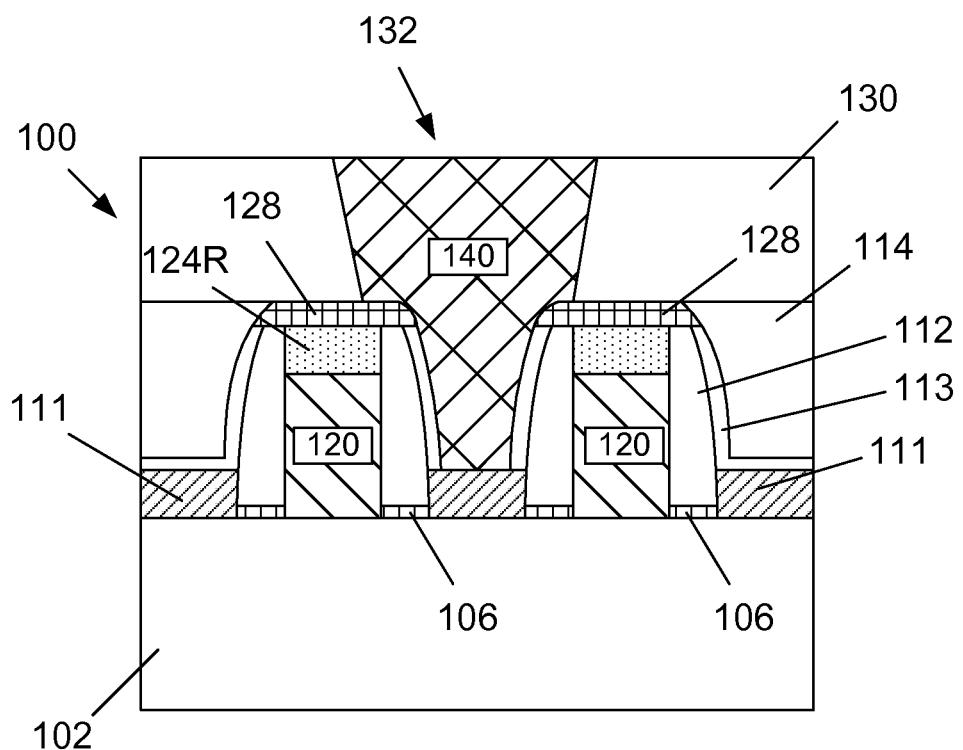

FIG. 3I depicts the product 100 after an illustrative conductive, self-aligned contact structure 140 has been formed in the self-aligned contact opening 132 such that it is conductively coupled to the source/drain regions 111. The self-aligned contact structure 140 is intended to be schematic and representative in nature, as it may be formed using any of a variety of different conductive materials and by performing traditional manufacturing operations. The self-aligned contact structure 140 may also contain one or more barrier layers (not depicted). In one illustrative example, the self-aligned contact structure 140 may be formed by depositing a liner, e.g., a titanium nitride liner, followed by overfilling the self-aligned contact openings 132 with a conductive material, such as tungsten. Thereafter, a CMP process may be performed to planarize the upper surface of the layer of insulating material 130, which results in the removal of excess portions of the liner and the tungsten positioned above the layer of insulating material 130 outside of the self-aligned contact opening 132 and the formation of the self-aligned contact structure 140. If desired, a metal silicide material (not shown) may be formed on the source/drain regions 111 prior to forming the self-aligned contact structure 140.

Figure 3J:
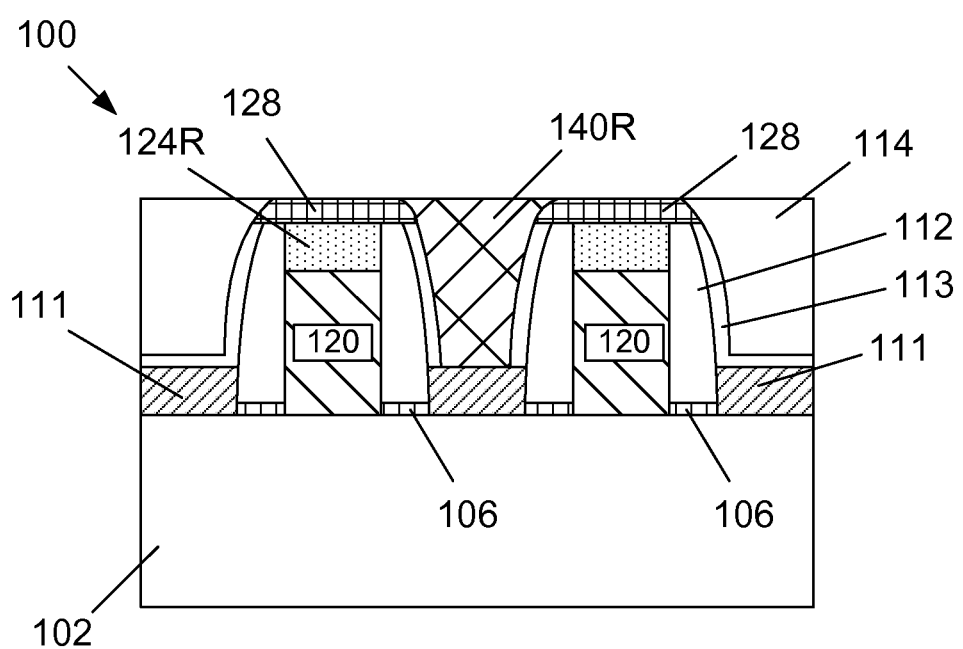

FIG. 3J depicts the product 100 after one or more planarization processes have been performed to remove the layer of insulating material 130 and portions of the self-aligned contact structure 140 positioned in the layer of insulating material 130. These process operations result in a reduced-height self-aligned contact structure 140R and exposes the sacrificial etch stop material layers 128 for further processing. In one example, the structure depicted in FIG. 3J may be achieved by performing one or more CMP processes that ultimately stops on or within the layer of insulating material 114. Those skilled in the art will recognize that there are other processing sequences that can be performed so as to result in the structure depicted in FIG. 3J, e.g., performing one or more etch-back process operations in combination with performing one or more CMP processes. Whatever particular processing sequence is selected, the sacrificial etch stop material layers 128 are exposed and ready to be removed.

Figure 3K:
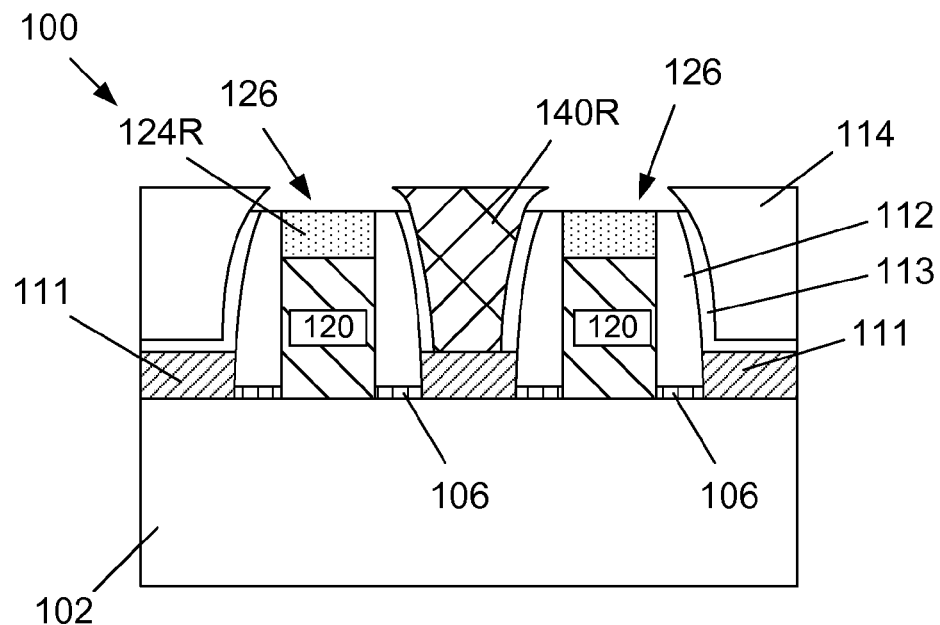

FIG. 3K depicts the product 100 after one or more dry or wet etching processes were performed to remove portions of the sacrificial etch stop material layers 128 so as to thereby re-expose the gate cap recess 126 above the now re-exposed recessed gate cap layers 124R.

Figure 3L:
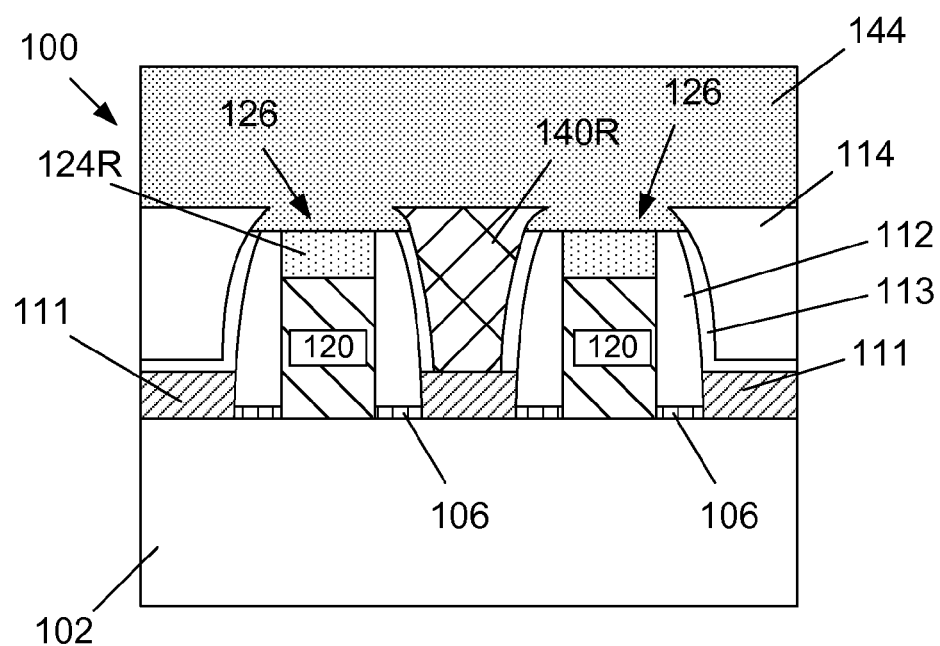

FIG. 3L depicts the product 100 after a layer of insulating material 144, e.g., silicon dioxide, etc., was deposited above the product 100 so as to overfill the gate cap recesses 126. In one embodiment, the layer of insulating material 144 may be a layer of silicon dioxide that is formed by performing a CVD process. The layer of insulating material 144 may be formed to any desired thickness and it may be comprised of the same material as that of the layer of insulating material 114 or it may be made of a different material.

Figure 3M:
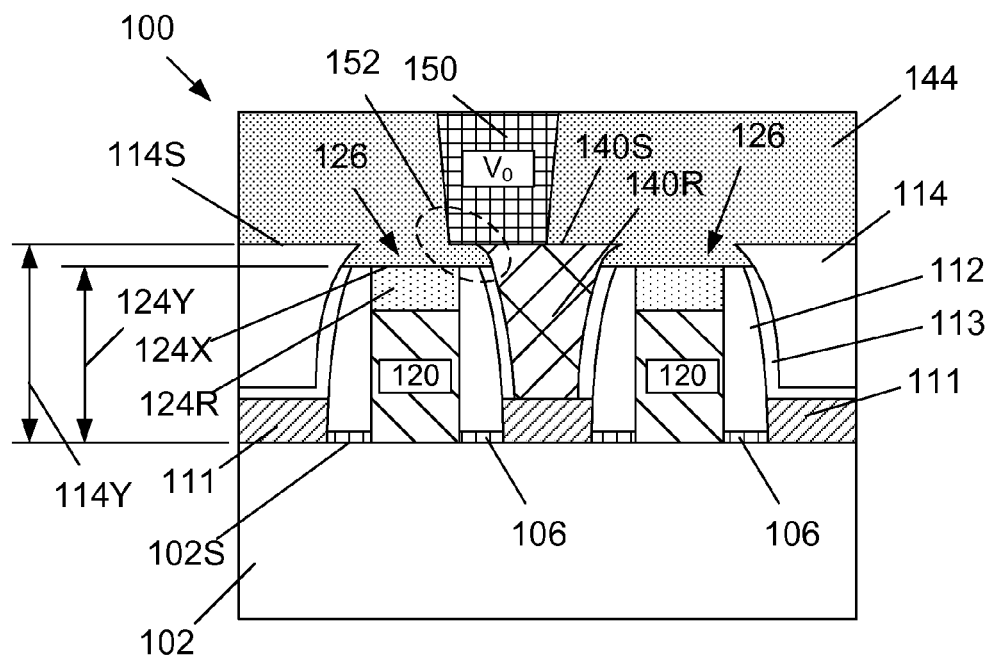

FIG. 3M depicts the product 100 after an illustrative "$V_o$" contact 150 is formed in the layer of insulating material 144. The $V_o$ contact 150 is conductively coupled to the reduced-height self-aligned contact structure 140R. As will be appreciated by those skilled in the art, in the depicted example, the $V_o$ contact 150 will be conductively coupled to a line in the so-called "Ml" metallization layer (not shown) that will be formed above the layer of insulating material 144. The $V_o$ contact 150 is intended to be schematic and representative in nature, as it may be formed using any of a variety of different conductive materials and by performing traditional manufacturing operations. Note that in the product 100 described above, the unique processing sequence results in a portion of the layer of insulating material 144 being positioned under an over-hanging portion of the $V_o$ contact 150—see the dashed area 152. The presence of the over-hanging portion of the $V_o$ contact 150 may also be beneficial in that it may provide a means of reducing the capacitance of the device since the area under the over-hanging portion may be filled with an insulating material, such as an oxide or a low-k material. In some cases, an air-gap or void may even form under all or a portion of the overhang. Therefore, compared to the nitride cap itself, the dielectric constant is much lower.

Figure 4A:
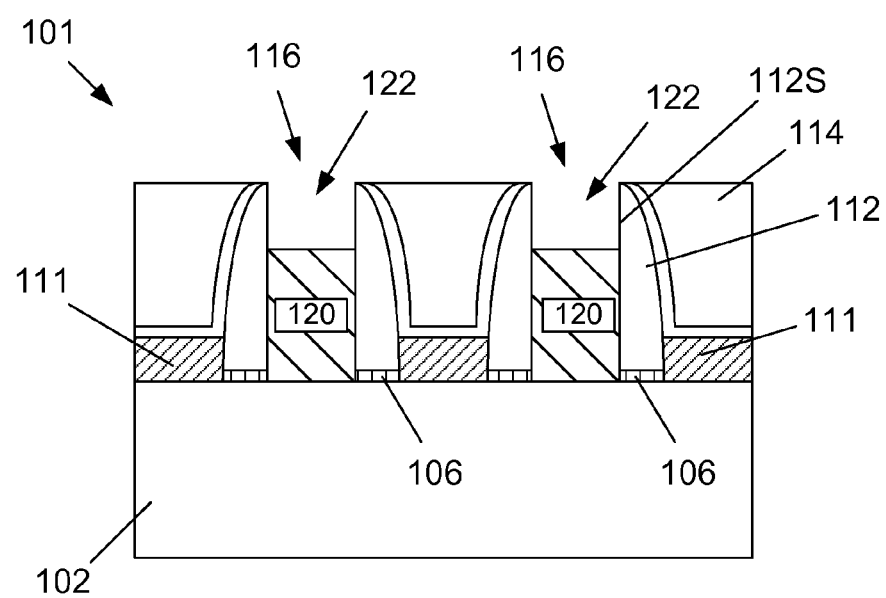
FIGS. 4A-4H depict another illustrative method disclosed herein for forming self-aligned contacts for a semiconductor device, and the resulting semiconductor device.

FIGS. 4A-4H depict another illustrative method disclosed herein for forming self-aligned contacts for a semiconductor device 101, and the resulting semiconductor device 101. FIG. 4A depicts the device 101 at a point of fabrication that approximately corresponds to that of the device 100 depicted in FIG. 3C, i.e., after the materials of the replacement gate structure 120 have been recessed so as to thereby define recesses 122 within the gate cavities 116.

Figure 4B:
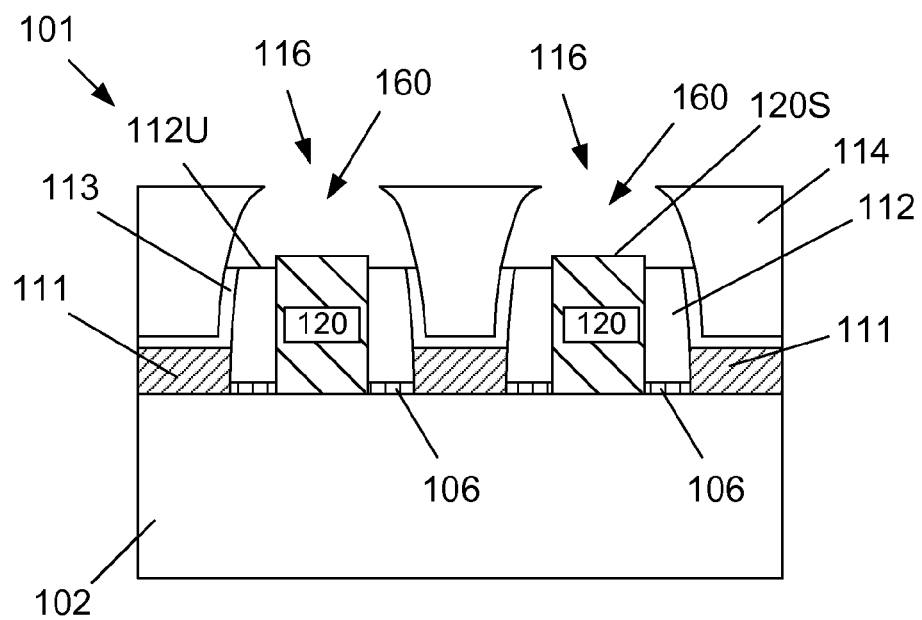

FIG. 4B depicts the product 101 after one or more dry or wet etching processes were performed to remove portions of the sidewall spacers 112 and the liner layer 113 so as to define recessed gate recesses 160 above the recessed replacement gate structure 120. In one illustrative embodiment, the recessed gate recesses 160 may be formed by performing a timed etch-back process. In one illustrative embodiment, the recessed gate recesses 160 are formed to such a depth that the upper surface 112U of the recessed spacers 112 is positioned slightly below, e.g., 1-3 nm below, the upper surface 120S of the recessed replacement gate structure 120. The overall depth of the recessed gate recesses 160 may vary depending upon the particular application, e.g., 20-40 nm.

Figure 4C:
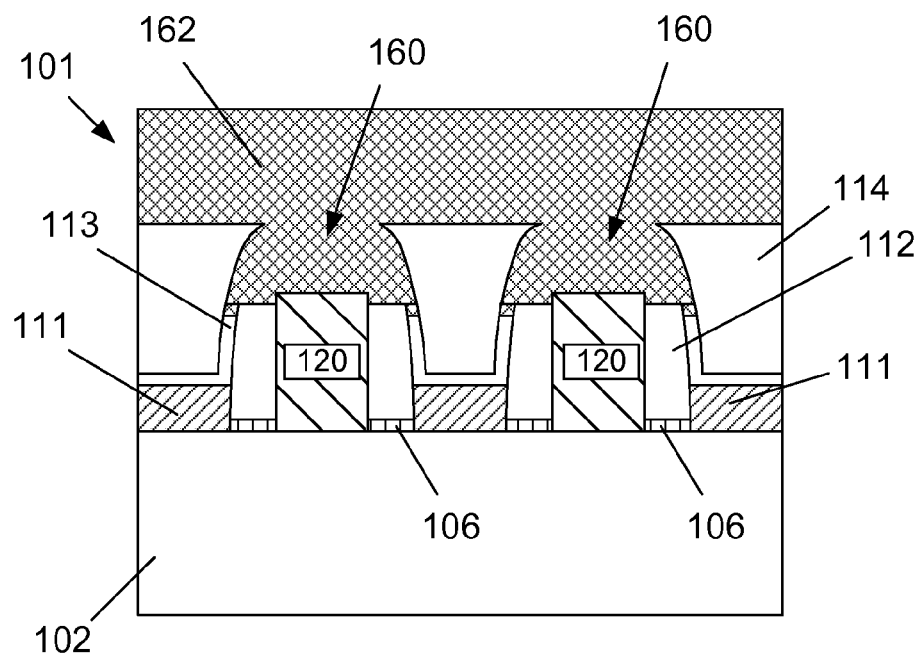

FIG. 4C depicts the product 101 after a sacrificial etch stop material layer 162 was blanket-deposited above the product 101 and in each of the recessed gate recesses 160. The sacrificial etch stop layer 162 may be comprised of a variety of materials that may be used to protect the recessed replacement gate structures 120 and the underlying recessed sidewall spacers 112 when a contact opening is subsequently etched in the layer of insulating material 114. For example, the sacrificial etch stop material layer 162 may be comprised of a metal or a metal compound, e.g., titanium-carbon, titanium nitride, a high-k material, polysilicon, amorphous silicon, etc., and it may be formed to any desired thickness.

Figure 4D:
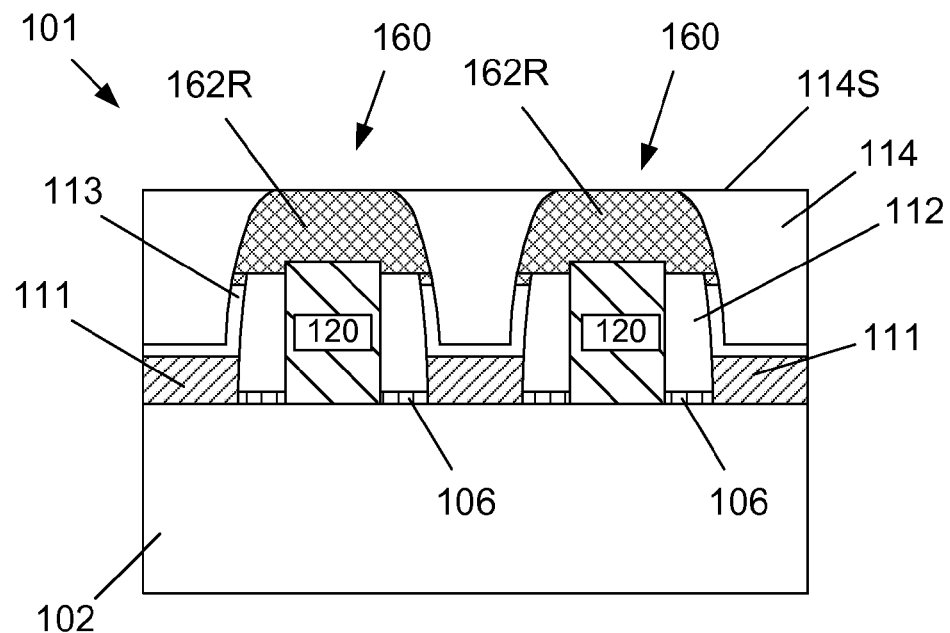

FIG. 4D depicts the product 101 after one or more CMP processes were performed to remove the portions of the sacrificial etch stop material layer 162 positioned above the surface 114S of the layer of insulating material 114 and outside of the recessed gate recesses 160. These process operations result in the formation of regions of sacrificial etch stop material 162R.

Figure 4E:
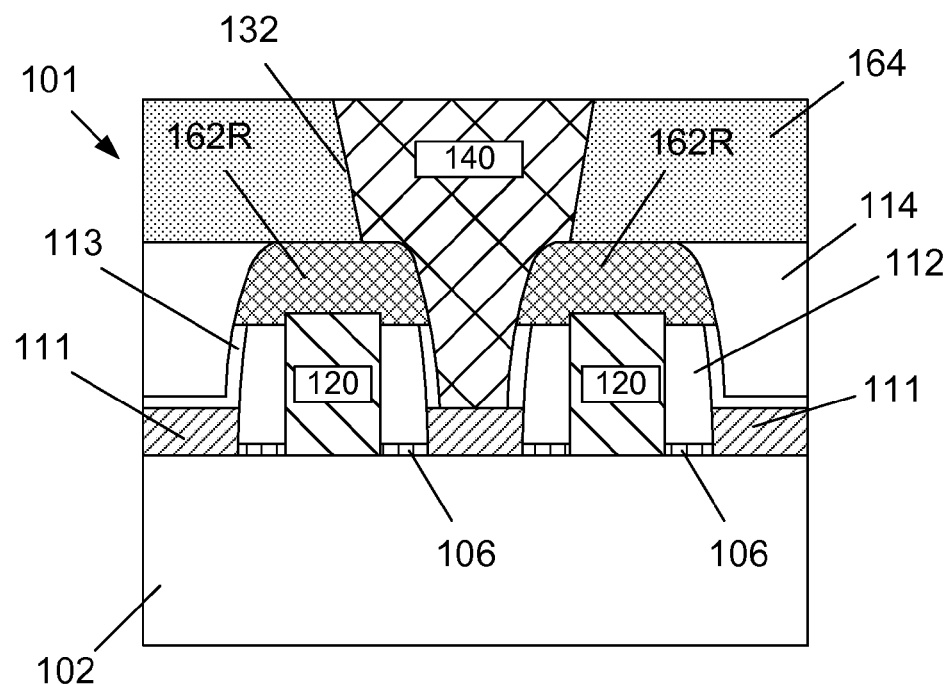

FIG. 4E depicts the product 101 after several process operations were performed. First, a layer of insulating material 164, e.g. silicon dioxide, etc., was deposited above the product 101. In one embodiment, the layer of insulating material 164 may be a layer of silicon dioxide that is formed by performing a CVD process. The layer of insulating material 164 may be formed to any desired thickness and it may be made of the same material as that of the layer 114 or it may be made of a different material. Then, one or more etching processes were performed on the product 101 through a patterned etch mask (not shown), such as a patterned layer of photoresist material, to remove portions of the layers of insulating material 164, 114 and the liner layer 113 so as to thereby define the above-described self-aligned contact opening 132 that exposes the raised source/drain region 111. Note, that the sacrificial etch stop material 162R serves to protect the recessed replacement gate structures 120 and the underlying portions of the sidewall spacers 112 during the etch sequence that is performed to form the contact opening 132. That is, the sacrificial etch stop materials 162R tend to limit the unwanted consumption of the recessed replacement gate structure 120 and the sidewall spacers 112 during the contact etch process. Then, the above-described self-aligned contact structure 140 was formed in the self-aligned contact opening 132 such that it is conductively coupled to the source/drain regions 111.

Figure 4F:
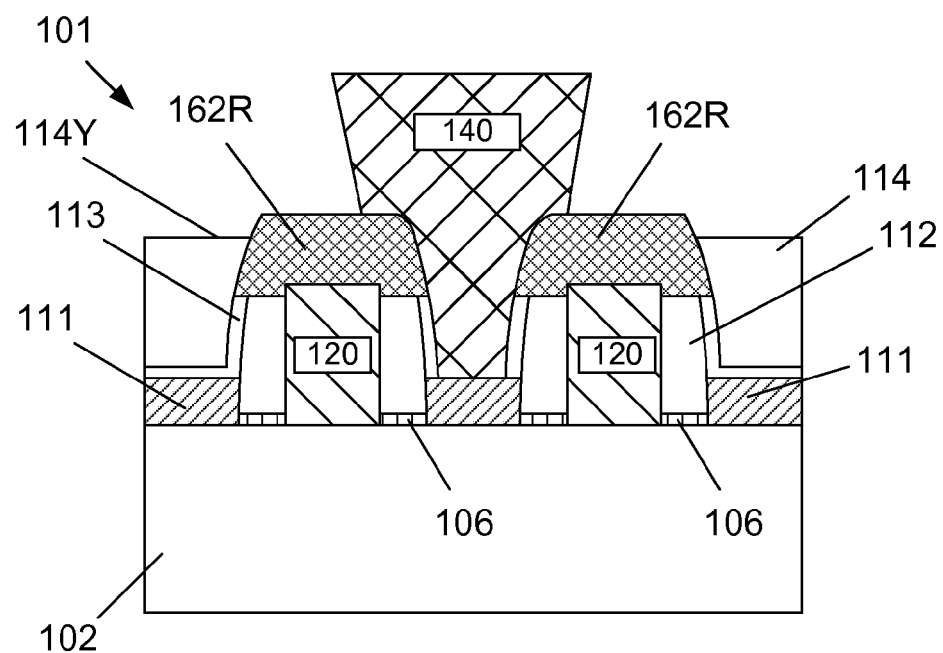

FIG. 4F depicts the product 101 after one or more dry or wet etching processes were performed to remove portions of the layer of insulating material 164 and perhaps some of the layer of insulating material 114 so as to thereby expose the sacrificial etch stop materials 162R.

Figure 4G:
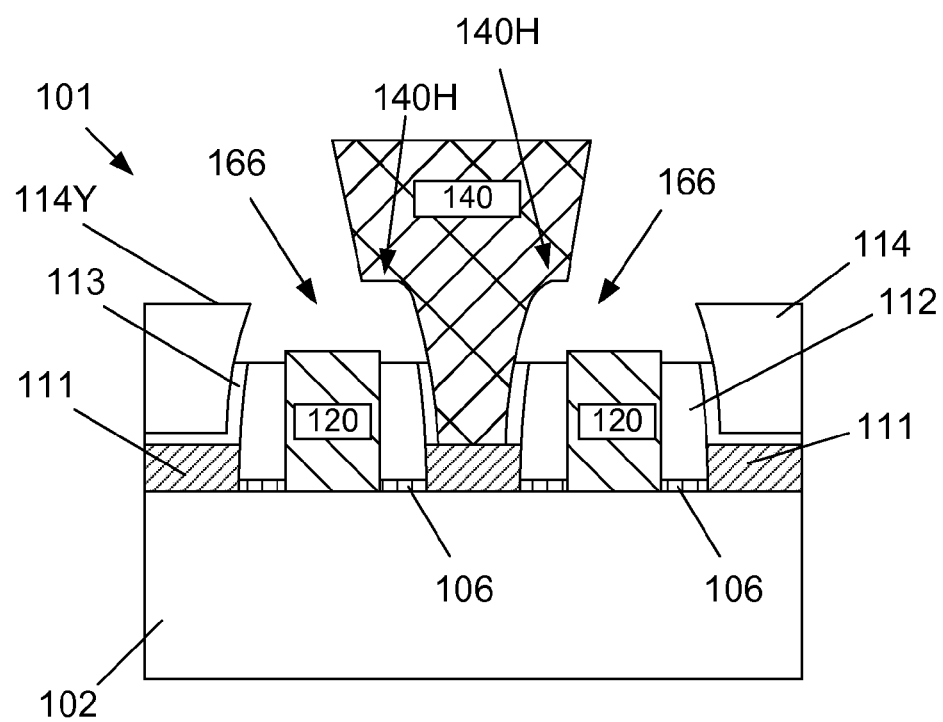

FIG. 4G depicts the product 101 after one or more dry or wet etching processes were performed to remove the sacrificial etch stop materials 162R selectively relative to the adjacent structures, i.e., relative to the recessed replacement gate structure 120, the sidewall spacers 112, the etch stop layer 113, the layer of insulating material 114 and the self-aligned contact structure 140. This etching process results in the formation of recessed gate cavities 166 wherein portions 140H of the self-aligned contact structure 140 are positioned laterally above portions of the recessed gate cavities 166.

Figure 4H:
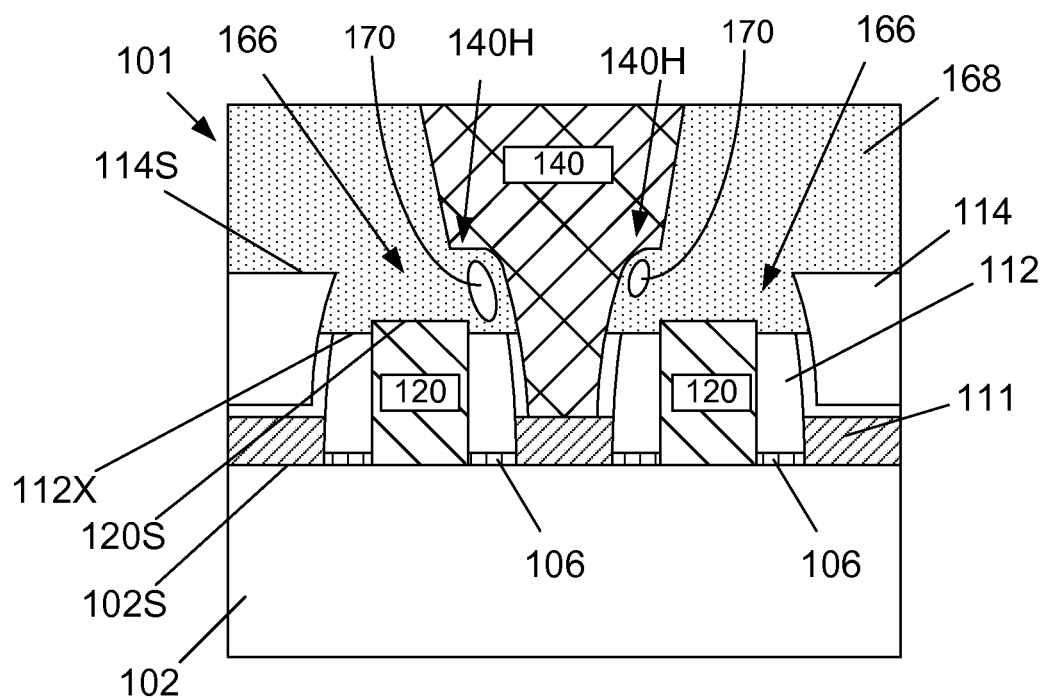

FIG. 4H depicts the product 101 after another layer of insulating material 168, e.g., silicon dioxide, a low-k material (k=3.3 or less), a flowable oxide material, etc., was deposited above the product 101 so as to overfill the recessed gate cavities 166 and after one or more CMP processes were performed to planarize the upper surface of the layer of insulating material 168 with the upper surface of the self-aligned contact structure 140. In one embodiment, the layer of insulating material 168 may be a layer of flowable oxide that is formed by performing a spin-coating process. The layer of insulating material 168 may be formed to any desired thickness and it may be comprised of the same material as that of the layer of insulating material 114 or it may be made of a different material. Note that, in some cases, illustrative voids 170 may form in the area under the overhanging regions 140H of the self-aligned contact structure 140. As before, this overhanging region may be beneficial in reducing the capacitance of the device.

As will be appreciated and understood by those skilled in the art after a complete reading of the present application, there are several novel methods and devices disclosed herein. For example, one illustrative method disclosed herein includes, among other things, forming a recess (126, 122) above a recessed replacement gate structure 120 that is positioned at least partially within a gate cavity 116 that is laterally defined by sidewall spacers 112 positioned in a first layer of insulating material 114, forming a sacrificial etch stop material (128, 162R) in the recess, forming a second layer of insulating material (130, 164) above at least the sacrificial etch stop material and the first layer of insulating material, with the sacrificial etch stop material (128, 162R) in position, performing at least one first etching process to form a self-aligned contact opening that extends through at least the first and second layers of insulating material thereby exposing a source/drain region 111 of the transistor, with the sacrificial etch stop material (128, 162R) in position, forming a self-aligned contact 140 in the self-aligned contact opening that is conductively coupled to the source/drain region, after forming the self-aligned contact 140, performing at least one process operation to expose and remove the sacrificial etch stop material (128, 162R) in the recess so as to thereby re-expose the recess, and forming a third layer of insulating material (144, 168) in at least the re-exposed recess.

Another illustrative method disclosed herein includes, among other things, forming a gate cap layer 124 above a recessed replacement gate structure 120 that is positioned within a gate cavity 116 that is laterally defined by sidewall spacers 112, performing at least one first etching process to remove a portion of the gate cap layer 124 and a portion of the sidewall spacers 112 so as to thereby define a recessed gate cap layer 124R and a gate cap recess 126 formed thereabove, forming a sacrificial etch stop material 128 in the gate cap recess 126, forming a first layer of insulating material 130 above at least the sacrificial etch stop material 128, with the sacrificial etch stop material 128 in position, performing at least one second etching process to form a self-aligned contact opening 132 that extends through at least the first layer of insulating material and exposes a source/drain region 111 of a transistor, forming an initial self-aligned contact 140 in the self-aligned contact opening 132 that is conductively coupled to the source/drain region 111, after forming the self-aligned contact 140, performing at least one process operation to expose the sacrificial etch stop material 128 in the gate cap recess 126 and remove a portion of the initial self-aligned contact 140 so as to thereby define a reduced-height self-aligned contact 140R, removing the exposed sacrificial etch stop material 128 in the gate cap recess 126 so as to thereby expose the recessed gate cap layer and forming a second layer of insulating material 144 above the exposed recessed gate cap layer 124R.

Yet another illustrative method disclosed herein includes, among other things, forming a recessed replacement gate structure 120 that is positioned within a gate cavity 116 that is laterally defined by sidewall spacers 112, performing at least one first etching process to remove a portion of at least the sidewall spacers 112 so as to thereby define a recessed gate recess 160 within the gate cavity 116, forming a sacrificial gate cap material in the recessed gate recess, forming a first layer of insulating material 164 above at least the sacrificial gate cap material 162R, with the sacrificial etch stop material 162R in position, performing at least one second etching process to form a self-aligned contact opening that extends through at least the first layer of insulating material 164 and exposes a source/drain region 111 of a transistor, forming a self-aligned contact 140 in the self-aligned contact opening that is conductively coupled to the source/drain region 111, after forming the self-aligned contact 140, performing at least one process operation to remove the first layer of insulating material 164 so as to thereby expose the sacrificial gate cap material 162R, removing the exposed sacrificial gate cap material 162R so as to thereby expose the recessed replacement gate structure 120 and forming a second layer of insulating material 168 on and in contact with the exposed recessed replacement gate structure 120.

One illustrative device disclosed herein includes, among other things, a replacement gate structure 120 positioned above a semiconductor substrate 102, sidewall spacers 112 positioned adjacent the replacement gate structure 120, a gate cap layer 124R positioned above the replacement gate structure 120, wherein the gate cap layer 124R has an upper surface 124X that is positioned a first distance 124Y above a surface 102S of the substrate 102, a first layer of insulating material 114 formed above the substrate adjacent the sidewall spacers 112, wherein the first layer of insulating material 114 has an upper surface 114S that is positioned a second distance 114Y above the surface 102S of the substrate 102 and a conductive contact 140R positioned in an opening formed in at least the layer of insulating material 114, wherein the conductive contact 140R is conductively coupled to the source/drain region 111 of the transistor, wherein the conductive contact 140R has an upper surface 140S that is positioned the second distance 114Y above the surface 102S of the substrate 102, wherein the first distance 124Y is less than the second distance 114Y.

Yet another illustrative device disclosed herein includes, among other things, a replacement gate structure 120 positioned above a semiconductor substrate 102, wherein the replacement gate structure 120 has an upper surface 120S, sidewall spacers 112 positioned adjacent the replacement gate structure 120, wherein each of the sidewall spacers have an upper surface 112X, a first layer of insulating material 114 formed above the substrate 102 adjacent the sidewall spacers 112, wherein the first layer of insulating material 114 has an upper surface 114S, wherein, relative to an upper surface 102S of the substrate 102, the upper surface 120S of the replacement gate structure 120 and the upper surfaces 112X of the sidewall spacers 112 are positioned at a level below the upper surface 114S of the first layer of insulating material 114, and wherein the first layer of insulating material 114, the upper surface 120S of the replacement gate structure 120 and the upper surfaces 112X of the sidewall spacers 112 at least partially define a recessed gate cavity 166, a conductive contact 140 positioned in an opening formed in at least the first layer of insulating material 114, wherein the conductive contact 140 is conductively coupled to a source/drain region 111 of the transistor, and a second layer of insulating material 168 positioned in at least the recessed gate cavity 166 and above the first layer of insulating material 114.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a transistor, comprising:
   forming a recess above a recessed replacement gate structure that is positioned at least partially within a gate cavity that is laterally defined by sidewall spacers positioned in a first layer of insulating material;
   forming a sacrificial etch stop material in said recess;
   forming a second layer of insulating material above at least said sacrificial etch stop material and said first layer of insulating material;

with said sacrificial etch stop material in position, performing at least one first etching process to form a self-aligned contact opening that extends through at least said second layer of insulating material and said first layer of insulating material and thereby exposes a source/drain region of said transistor;

with said sacrificial etch stop material in position, forming a self-aligned contact in said self-aligned contact opening that is conductively coupled to said source/drain region;

after forming said self-aligned contact, performing at least one process operation to expose and remove said sacrificial etch stop material in said recess so as to thereby re-expose said recess; and forming a third layer of insulating material in at least said re-exposed recess.

2. The method of claim 1, wherein said layer of insulating material has an upper surface and wherein said recess has a lower surface that is positioned at a level that is below said upper surface of said layer of insulating material.

3. The method of claim 1, wherein forming said recess comprises:
    forming a gate cap layer above said recessed replacement gate structure; and
    performing at least one second etching process to remove a portion of said gate cap layer and a portion of said sidewall spacers so as to thereby define said recess.

4. The method of claim 1, wherein forming said recess comprises performing at least one second etching process to remove a portion of at least said sidewall spacers so as to thereby define said recess.

5. The method of claim 1, further comprising forming a $V_o$ conductive contact in said third layer of insulating material, wherein said $V_o$ conductive contact is conductively coupled to said self-aligned contact.

6. The method of claim 1, wherein said sacrificial etch stop material is comprised of a metal, a metal compound, polysilicon or amorphous silicon.

7. The method of claim 1, wherein forming said sacrificial etch stop layer in said gate cap recess comprises:
    depositing a layer of etch stop material in said recess; and
    performing at least one CMP process to remove portions of said layer of etch stop material positioned outside of said recess.

8. The method of claim 1, wherein performing said at least one process operation to expose said sacrificial etch stop material in said recess comprises performing at least one of a CMP process operation and an etching process operation.

9. The method of claim 1, wherein said recessed replacement gate structure is comprised of a high-k gate insulation layer and at least one layer of metal.

10. A method of forming a transistor, comprising:
    forming a gate cap layer above a recessed replacement gate structure that is positioned within a gate cavity that is laterally defined by sidewall spacers;
    performing at least one first etching process to remove a portion of said gate cap layer and a portion of said sidewall spacers so as to thereby define a recessed gate cap layer and a gate cap recess formed thereabove;
    forming a sacrificial etch stop material in said gate cap recess;
    forming a first layer of insulating material above at least said sacrificial etch stop material;
    with said sacrificial etch stop material in position, performing at least one second etching process to form a self-aligned contact opening that extends through at least said first layer of insulating material and exposes a source/drain region of said transistor;
    forming an initial self-aligned contact in said self-aligned contact opening that is conductively coupled to said source/drain region;
    after forming said self-aligned contact, performing at least one process operation to expose said sacrificial etch stop material in said gate cap recess and remove a portion of said initial self-aligned contact so as to thereby define a reduced-height self-aligned contact;
    removing said exposed sacrificial etch stop material in said gate cap recess so as to thereby expose said recessed gate cap layer; and
    forming a second layer of insulating material above said exposed recessed gate cap layer.

11. The method of claim 10, further comprising forming a $V_O$ conductive contact in said second layer of insulating material, wherein said $V_O$ conductive contact is conductively coupled to said reduced-height self-aligned contact.

12. The method of claim 10, wherein forming said sacrificial etch stop material in said gate cap recess comprises:
    depositing a layer of etch stop material in said gate cap recess; and
    performing at least one CMP process to remove portions of said layer of etch stop material positioned outside of said gate cap recess.

13. The method of claim 10, wherein performing said at least one process operation to expose said sacrificial etch stop material in said gate cap recess and remove said portion of said initial self-aligned contact comprises performing at least one of a CMP process operation and an etching process operation.

14. A method of forming a transistor, comprising:
    forming a sacrificial gate structure above a semiconductor substrate and a first gate cap layer above said sacrificial gate structure;
    forming sidewall spacers adjacent said sacrificial gate structure;
    forming a first layer of insulating material above said substrate adjacent said sidewall spacers;
    performing at least one first etching process to remove said first gate cap layer and said sacrificial gate structure so as to thereby define a gate cavity that is laterally defined by sidewall spacers;
    forming a recessed replacement gate structure in said gate cavity;
    forming a second gate cap layer above a recessed replacement gate structure;
    performing at least one second etching process to remove a portion of said second gate cap layer and a portion of said sidewall spacers so as to thereby define a recessed second gate cap layer and a gate cap recess formed thereabove;
    forming a sacrificial etch stop material in said gate cap recess;
    forming a second layer of insulating material above at least said sacrificial etch stop material;
    with said sacrificial etch stop material in position, performing at least one second etching process to form a self-aligned contact opening that extends through at least said second layer of insulating material and said first layer of insulating material and exposes a source/drain region of said transistor;
    forming an initial self-aligned contact in said self-aligned contact opening that is conductively coupled to said source/drain region;

after forming said self-aligned contact, performing at least one process operation to expose said sacrificial etch stop material in said gate cap recess and remove a portion of said initial self-aligned contact so as to thereby define a reduced-height self-aligned contact;

removing said exposed sacrificial etch stop material in said gate cap recess so as to thereby expose said recessed gate cap layer; and forming a third layer of insulating material above at least said exposed recessed gate cap layer.

15. The method of claim 14, further comprising forming a $V_O$ conductive contact in said third layer of insulating material, wherein said $V_O$ conductive contact is conductively coupled to said reduced-height self-aligned contact.

16. A method of forming a transistor, comprising:

forming a recessed replacement gate structure that is positioned within a gate cavity that is laterally defined by sidewall spacers;

performing at least one first etching process to remove a portion of at least said sidewall spacers so as to thereby define a recessed gate recess within said gate cavity;

forming a sacrificial etch stop material in said recessed gate recess;

forming a first layer of insulating material above at least said sacrificial etch stop material;

with said sacrificial etch stop material in position, performing at least one second etching process to form a self-aligned contact opening that extends through at least said first layer of insulating material and exposes a source/drain region of said transistor;

forming a self-aligned contact in said self-aligned contact opening that is conductively coupled to said source/drain region;

after forming said self-aligned contact, performing at least one process operation to remove said first layer of insulating material, so as to thereby expose said sacrificial etch stop material;

removing said exposed sacrificial etch stop material so as to thereby expose said recessed replacement gate structure; and forming a second layer of insulating material on and in contact with at least said exposed recessed replacement gate structure.

17. The method of claim 16, wherein said sacrificial etch stop material is comprised of a metal, a metal compound, polysilicon, or amorphous silicon.

18. The method of claim 16, wherein forming said sacrificial etch stop material in said recessed gate recess comprises:

depositing a layer of sacrificial etch stop material in said recessed gate recess; and performing at least one CMP process to remove portions of said layer of sacrificial etch stop material positioned outside of said recessed gate recess.

19. A method of forming a transistor, comprising:

forming a sacrificial gate structure above a semiconductor substrate and a first gate cap layer above said sacrificial gate structure;

forming sidewall spacers adjacent said sacrificial gate structure;

forming a first layer of insulating material above said substrate adjacent said sidewall spacers;

performing at least one first etching process to remove said first gate cap layer and said sacrificial gate structure so as to thereby define a gate cavity that is laterally defined by said sidewall spacers;

forming a recessed replacement gate structure in said gate cavity;

performing at least one second etching process to remove a portion of at least said sidewall spacers and define a recessed gate recess within said gate cavity;

forming a sacrificial gate cap material in said recessed gate recess;

forming a second layer of insulating material above at least said sacrificial gate cap material and said first layer of insulating material;

with said sacrificial gate cap material in position, performing at least one third etching process to form a self-aligned contact opening that extends through at least said second layer of insulating material and said first layer of insulating material and exposes a source/drain region of said transistor;

forming a self-aligned contact in said self-aligned contact opening that is conductively coupled to said source/drain region;

after forming said self-aligned contact, performing at least one process operation to remove said second layer of insulating material, so as to thereby expose said sacrificial gate cap material;

removing said exposed sacrificial gate cap material so as to thereby expose said recessed replacement gate structure; and forming a third layer of insulating material above at least said exposed recessed replacement gate structure.

20. The method of claim 19, wherein said sacrificial gate cap material is comprised of a metal, a metal compound, polysilicon, or amorphous silicon.

* * * * *